United States Patent [19]

Pelletier et al.

[11] Patent Number: 4,494,014
[45] Date of Patent: Jan. 15, 1985

[54] ANALOGUE CURRENT SWITCH BIPOLAR INJECTION TECHNOLOGY

[75] Inventors: Joël A. Pelletier, Les Essarts le Roi; Robert Breuillard, Deuil la Barre, both of France

[73] Assignee: U.S. Philips Corporation, New York, N.Y.

[21] Appl. No.: 391,265

[22] Filed: Jun. 24, 1982

[30] Foreign Application Priority Data

Jul. 3, 1981 [FR] France .................................. 81 13141

[51] Int. Cl.³ .................... H03K 17/60; H03K 19/091
[52] U.S. Cl. .................................... 307/254; 307/459; 307/477
[58] Field of Search .............. 307/459, 477, 254, 255; 357/92

[56] References Cited

U.S. PATENT DOCUMENTS 4,357,548  11/1982  Preslar ................................. 307/459

Primary Examiner—John Zazworsky
Attorney, Agent, or Firm—Robert T. Mayer; Bernard Franzblau

[57] ABSTRACT

An analogue current switch comprising a cascade of n identical switching elements, each element comprising an I²L integrated current-injection logic gate having one or more collector outputs. The signal input ($e_1$) is the emitter of the PNP injection transistor ($T_1$), the switching-signal input ($e_2$) is the base of the NPN switching transistor ($T_2$), and the signal output (s) is the junction point of the emitter of $T_2$ and the base of $T_1$.

9 Claims, 6 Drawing Figures

ANALOGUE CURRENT SWITCH BIPOLAR INJECTION TECHNOLOGY

This invention relates to an analogue current switch formed by means of switching elements comprising integrated current-injection logic gates of the I²L type. These switching elements each comprise a signal input at the emitter of the injection transistor and a switching-signal input at the base of the switching transistor. The last-mentioned transistor comprises m collectors one of which is coupled to the base of said switching transistor and the other m−1 of which are connected to respective ones of the m−1 current inputs. The switching signal either turns on said switching transistor so that the current supplied by a current source and injected at said signal input is reflected to said m−1 current inputs, or turns off said transistor so that said injected current is diverted towards the switching-signal input.

Such a device in which one of the switching signal commands causes the current to be reflected in the multiplicity of collectors of the I²L gate is known from French Patent Specification No. 2,316,804 entitled "multilevel injection-logic semiconductor device". This Specification describes how special logic functions, e.g. those of the kind mentioned in the opening paragraph, can be obtained. This reflection function is specifically utilized for the formation of current mirrors (see Japanese Patent Specification No. 53 147 892).

However, the prior-art logic devices do not perform the function of transferring the injected current. It is an object of the invention to fill this gap by forming an analogue switching element based on the I²L gate, which element is simplified in comparison with the many known variants of transistor switches and has the advantage that it also transfers the injected current. This advantage is obtained in addition to those inherent in I²L integrated circuits, namely their high integration density and their low dissipation, which enables their field of application to be extended to, for example, digital-to-analogue signal processing.

According to the invention said switching element moreover comprises a signal output at the junction point of the base of said injection transistor and the emitter of said switching transistor such that in said turned-on state the injected current is transferred to said signal output with a specific transfer coefficient which is a function of the characteristics of said transistors of the I²L gate.

The calculation in the following description shows that said transfer coefficient becomes exactly equal to unity when the switching transistor comprises only one collector, which is particularly interesting for the use of the switching element thus formed in, for example, digital-to-analogue converters.

The invention will now be described in more detail, by way of example, with reference to the accompanying drawings, in which.

Figure 1:
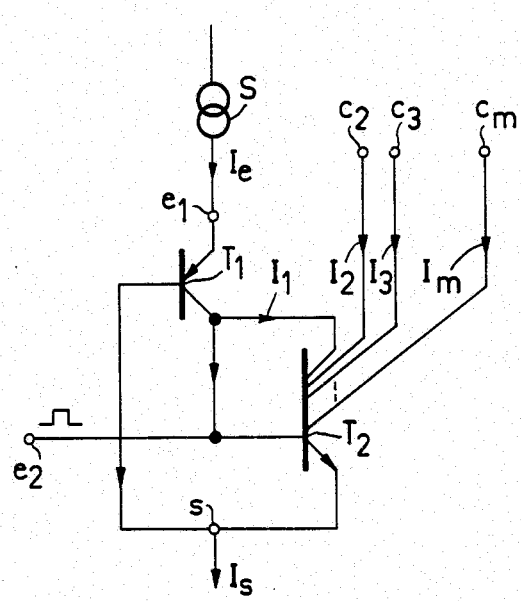
FIG. 1 is a diagram of the analogue switching element in accordance with the invention.

In FIG. 1 the integrated current-injection logic gate of the I²L type comprises a PNP-transistor $T_1$ and an NAN-transistor $T_2$. The emitter and the collector of $T_1$ are respectively constituted by two P-zones which are diffused simultaneously into an epitaxial N-zone to form a lateral transistor. The epitaxial zone constitutes the base of $T_1$ and the emitter of $T_2$. The transistor $T_2$ comprises m collectors formed by N+ diffusions in the P-type collector zone of $T_1$, thereby forming the base zones of $T_2$ in the parts underlying the said m N+-diffusions. If any one of the said m collectors is coupled to the base of $T_2$, the other m−1 collectors being connected to the current inputs $C_2, C_3 \ldots C_m$ to which current injectors, not shown, are connected, the current $I_e$ from a current source S, which is connected to the signal input $e_1$ at the emitter of $T_1$, is reflected to said m collectors as currents $I_1, I_2, \ldots I_m$ when a logic command applied to the switching signal input $e_2$ at the base of $T_2$ turns on the last-mentioned transistor. Since the diffusions of the m collectors of $T_2$ are situated very close to each other it may be assumed that the characteristics of the m corresponding partial transistors are identical if the areas of the m collectors are equal. As a result of this the currents $I_1, I_2, \ldots I_m$ are equal. A calculation shows that they have the following value:

$$I_1 = I_2 = \ldots I_m = \frac{1}{\left(1 + \frac{1}{\beta_p}\right)\left(1 + \frac{m}{\beta_N}\right)} I_e$$

in which $\beta_p$ is the current gain of $T_1$ in common-emitter arrangement and $\beta_N$ the current gain of each partial transistor of $T_2$ in common-emitter arrangement. If $\beta_p$ and $\beta_N$ are high the currents $I_1, I_2, \ldots I_m$ will be substantially equal to the injected current $I_e$, which is consequently reflected to each of the collectors of $T_2$.

In order to ensure that the injected current is also transferred when the switching signal turns on transistor $T_2$ in accordance with the invention, the current switching element of FIG. 1 moreover comprises a signal output s formed by the junction point of the base of $T_1$ and the emitter of $T_2$. The current transferred to the signal output s is consequently the sum of the various emitter currents of $T_2$, which correspond to its m collectors, and the base current of $T_1$. Moreover, the collector current of $T_1$ is the sum of the current $I_1$ in the collector of $T_2$ which is coupled to the base of this transistor and the base currents corresponding to the m−1 other collectors of $T_2$, i.e.

$$\left(\frac{I_2}{\beta_{N2}} \cdots \frac{I_m}{\beta_{NM}}\right)$$

Combining these results yields the expression for the transferred current $I_s$ in its most general form:

$$I_s = \frac{1 + \sum_{i=2}^{m} k_1}{1 + \frac{\sum_{i=2}^{m} \frac{k_i}{\beta_{Ni}+1}}{1 + \frac{1}{\beta_p}} I_e} + \frac{1}{\beta_p}$$

where $k_i = \frac{\text{emitter current corresponding to the collector } i}{\text{emitter current corresponding to the collector 1}}$ and $\beta_{Ni}$ = current gain of the transistor $T_2$ corresponding to the collector i, the collector 1 being the collector which is coupled to the base of $T_2$.

If the ratio $k_i$ is written as $K_i = 1 + \epsilon_i$, the term $\epsilon_i$ represents the distribution of the emitter current corresponding to the collector i relative to the emitter current corresponding to the collector 1. The current $I_s$ is then written:

$$I_s = \frac{m + \sum_{i=2}^{m} \epsilon_i}{1 + \frac{\sum_{i=2}^{m} \frac{1+\epsilon_i}{\beta_{Ni}+1}}{1 + \frac{1}{\beta_p}} I_e} + \frac{1}{\beta_p}$$

The terms $\epsilon_i$ become substantially zero if the m collectors are identical and the transfer coefficient then has the value:

$$\frac{I_s}{I_e} = \frac{m}{1 + \frac{\frac{m-1}{\beta_{N+1}}}{1 + \frac{1}{\beta_p}}} + \frac{1}{\beta_p}$$

When the switching signal turns off transistor $T_2$ the part of the injected current constituted by the collector current $\alpha_p I_e$ of $T_1$ ($\alpha_p$ being the gain in common-base arrangement) is diverted to the switching signal input $e_2$, whereas the other part of the injected current constituted by the base current $(1-\alpha_p)I_e$ of $T_1$ gives rise to an undesired transfer to the signal output s.

Figure 2:
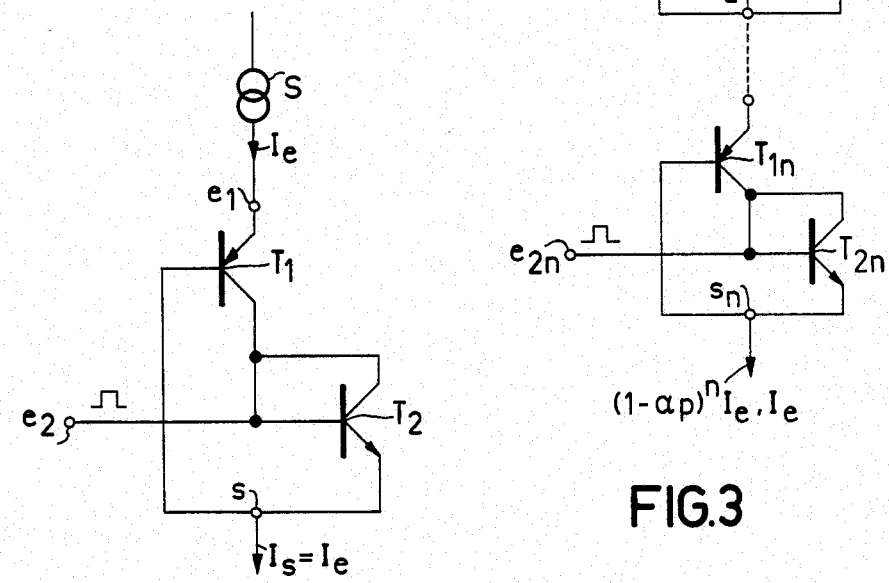
FIG. 2 is a diagram of a simplified version of the switching element shown in FIG. 1.

FIG. 2 shows the circuit diagram of an analogue current switch in which the transistor $T_2$ comprises only one collector which is coupled to its base. The expression for the transfer coefficient given in the foregoing shows that it is independent of current gain factors and is equal to unity. The current $I_e$ injected at the signal input $e_1$ is therefore completely transferred to the signal output s, which may be used to advantage in digital-to-analogue signal processing.

Figure 3:
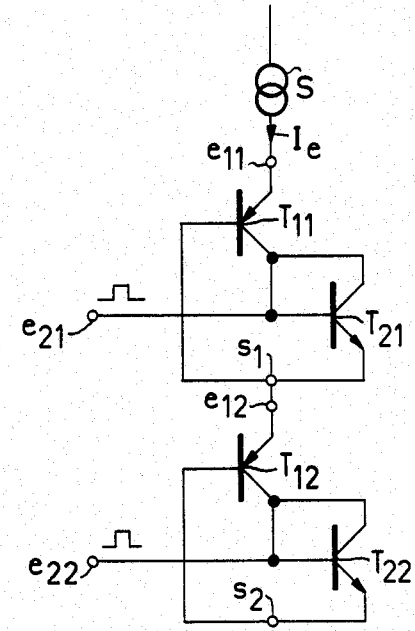
FIG. 3 is a diagram of a switch comprising a cascade of n identical switching elements as shown in the diagram of FIG. 2.

A method of reducing the undesirable transfer of the base current of $T_1$ when $T_2$ is not conductive is to provide a switch as represented schematically in FIG. 3. This switch comprises the cascade of n identical switching elements, for example as shown in the diagram of FIG. 2, each element i having its signal input $e_{1i}$ connected to the signal output $s_{i-1}$ of the preceding element. The signal input is the signal input $e_{11}$ of the first element, the signal output is the signal output $s_n$ of the $n^{th}$ element, and the n switching-signal inputs $e_{21}, e_{22}, \ldots e_{2n}$ receive the same signal value simultaneously. Thus, when the n switching transistors are conductive, the injected current $I_e$ is completely transferred to the signal output, while in their non-conductive states the undesirable signal that is transferred has the value $(1-\alpha_p)^n I_e$. For a mean value $\beta_p = 10$ of the current gain of a lateral PNP transistor the undesirable transfer by a switching element is substantially equal to one tenth of the injected current, which when such a switching element is used in digital-to-analogue converters in the main invalidates analogue quantities which correspond to small weights of the digital signal. Cascading three switching elements reduces the undesirable signal by a factor of 120. It is to be noted that the n $I^2L$ switching elements should be formed in islands which are isolated from each other.

Figure 4:
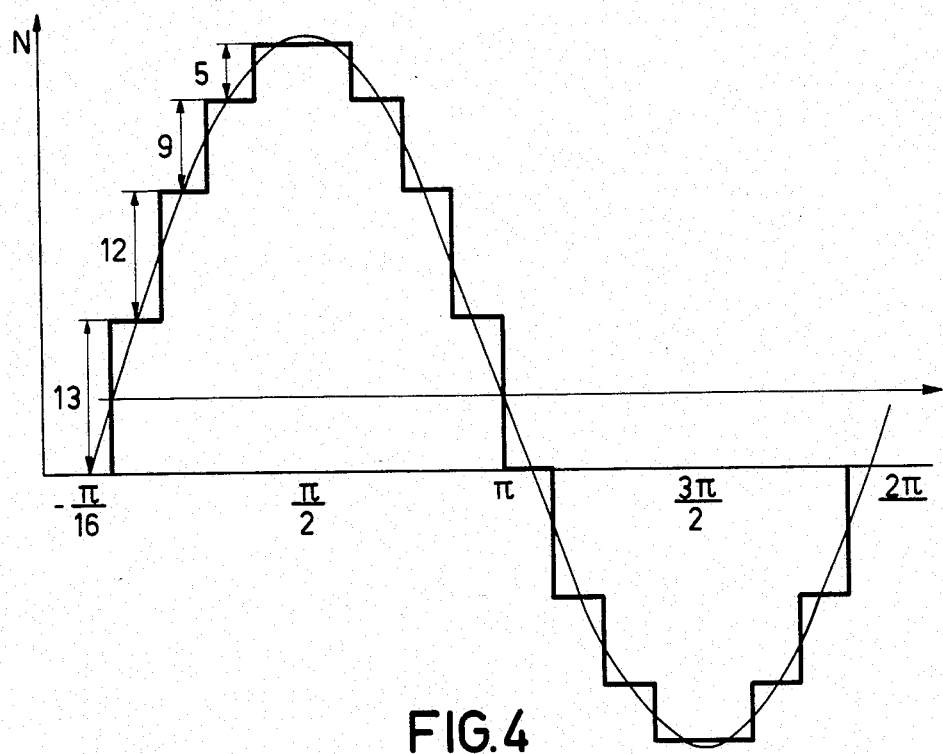
FIG. 4 illustrates by way of example how a sinusoidal function is sampled, which function is synthesized by means of a digital-to-analogue converter equipped with switching elements in accordance with the simplified diagram of FIG. 2.

An example of an application is the synthesis of a sinusoidal function by means of a digital-to-analogue converter provided with the simplified version of the switching elements shown in FIG. 2. FIG. 4 shows the variation of the synthesized levels N of such a function with the angular variable $\pi/16 + K(\pi/8)$, K being a positive or negative integer. These synthesized levels are obtained as follows, in conformity with the Table I given hereinafter. The second column of this Table gives the values of sin $(\pi/16 + K(\pi/8))$ for K=0, 1, 2 and 3. The third column gives the calculated levels of the function obtained by multiplying the various values of sin $(\pi/16 + K(\pi/8))$ by the factor 33.3, and the fourth column of the Table gives the synthesized levels with the tenths rounded off to 5. In this way, if $-\pi/16(K=-1)$ is assumed to be an origin, the difference between the consecutive synthesized levels have the values of the integers 13, 12, 9 and 5 which can be reproduced by means of the function $a + b.4 + c.4 + d.4$, in which a, b and c may take the values 0 or 1 and d has the value 1. As a result of symmetry said differences in levels obtained in the third quadrant of the angular variable are the same for the three others, except for the sign. They are successively added to each other in the increasing ranges of the sinusoidal function and are subtracted from each other in the decreasing ranges in conformity with the sixteen sampling levels distributed over one period, in such a way that an approximation to the function is formed.

TABLE I

| K | $\sin\left(\frac{\pi}{16} + K\frac{\pi}{8}\right)$ | Calculated level | Synthesized level |
|---|---|---|---|
| 0 | 0.195 | 6.5 | 6.5 |
| 1 | 0.555 | 18.5 | 18.5 |
| 2 | 0.831 | 27.9 | 27.5 |
| 3 | 0.950 | 32.6 | 32.5 |

Figure 5:
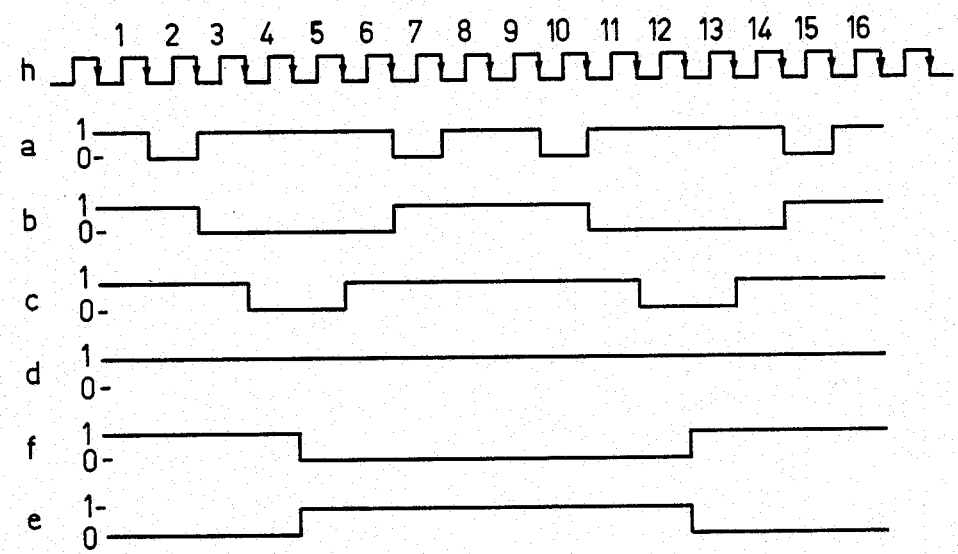
FIG. 5 shows the digital signals applied to the converter as a function of time.

FIG. 5 shows the variation as a function of time, indicated by a clock signal h, of the weighting coefficients a, b, c and d of the function defined in the foregoing. Each period of the clock signal corresponds to an angular variation of $\pi/8$ between two consecutive sampling levels. The signal f and its complement e are used for assigning the + sign or the − sign to the differences between the synthesized levels depending on whether the sinusoidal function is increasing or decreasing.

Figure 6:
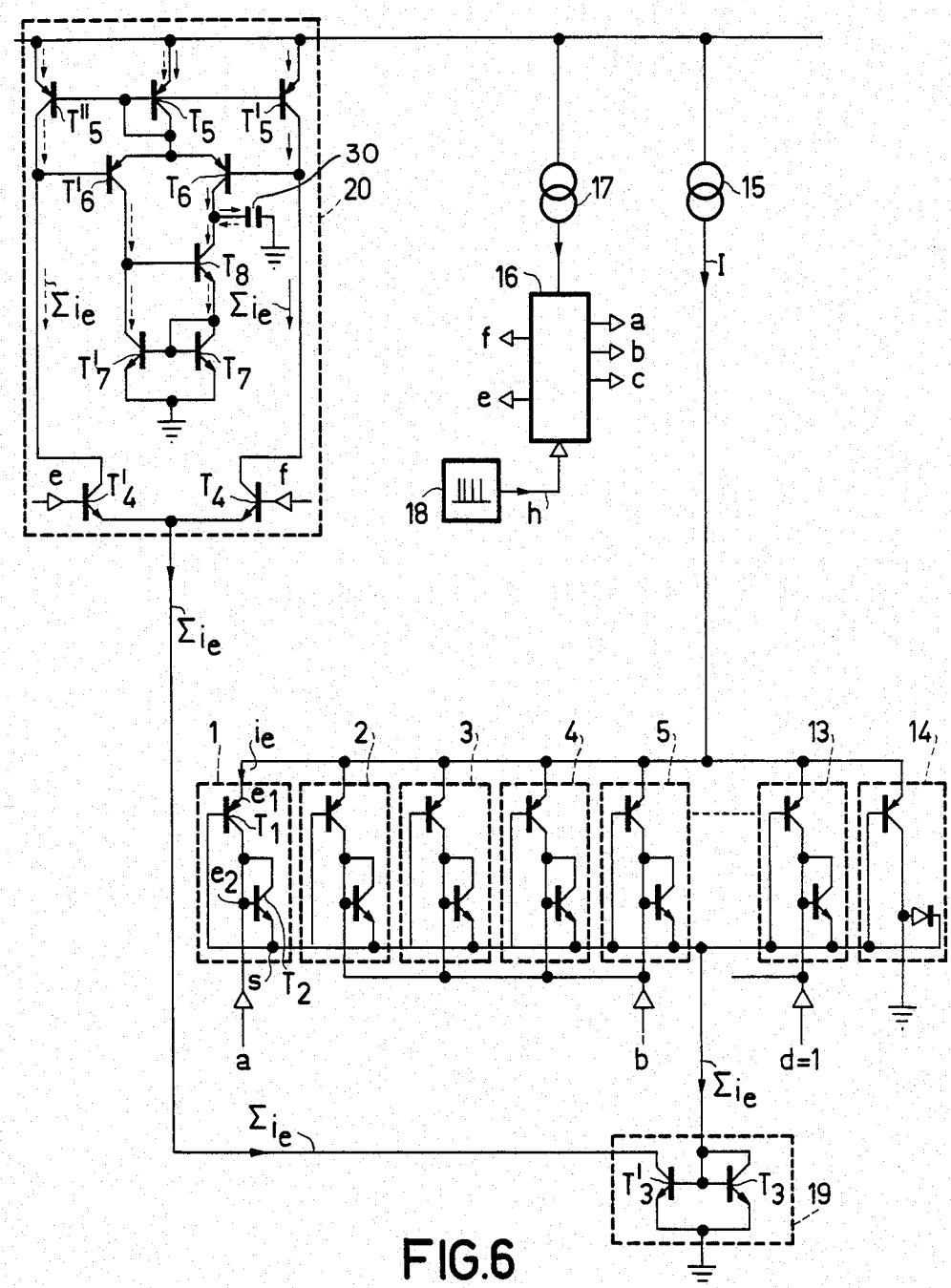
FIG. 6 is a diagram of an example of said digital-to-analogue converter.

The digital-to-analogue converter for carrying out the synthesis of the sinusoidal function shown in FIG. 4 is shown schematically in FIG. 6. A current source 15 energizes an arrangement of identical switching elements which are each in accordance with the simplified diagram shown in FIG. 2 and bear the respective references 1 to 14. The signal inputs $e_1$ of the switching elements are connected to the current source 15 in such a way that the current I supplied by said source is equally distributed among these signal inputs, which inputs each receive a current $i_e$. The I²L logic device 16, energized by the current source 17 and controlled by the clock signal h from the clock generator 18, supplies the signals a, b, c, e and f shown in FIG. 5. The switching element 1 has its switching signal input $e_2$ connected to the logic device 16, which supplies the signal a to said element. The switching elements 2 to 13 comprise three groups of four elements, each group having its switching-signal inputs $e_2$ interconnected and the logic device 16 applying the signals b and c to the first and second groups of inputs $e_2$ respectively, a constant level d=1 being applied to the third group. The switch 14, which is not used but which is formed together with the preceding switch for technological reasons, is disabled by connecting its switching-signal input directly to ground. The signal outputs s of the switches 1 to 14 are also interconnected in order to receive the weighted sum of the currents $\Sigma i_e = a \cdot i_e + b \cdot 4i_e + c \cdot 4i_e + d \cdot 4i_e$ proportional to the function defined in the foregoing. Each combination of weighting coefficients a, b, c and d thus corresponds to the difference between two consecutive synthesized levels. This consecutively yields the values $13i_e$, $12i_e$, $9i_e$ and $5i_e$ corresponding to an angular variation in steps of $\pi/8$ in the first quadrant of the variable where the sinusoidal function increases. When this function decreases in the second quadrant and in the third quadrant the same values are found for the differences between the synthesized levels but with a negative sign. They recur with a positive sign when the function increases again in the fourth quadrant.

In order to transform $\Sigma i_e$ into $\pm \Sigma i_e$ the weighted sum of the currents is first passed through an intermediate circuit 19, which in the form shown is a current mirror comprising the transistor pair $T_3 - T'_3$ arranged as shown in the Figure. Subsequently the sum $\Sigma i_e$ is transferred from the collector of transistor $T'_3$ to the interconnected emitters of the transistor pair $T_4 - T'_4$ belonging to the circuit 20, which operates as follows. When the difference between two consecutive synthesized levels is positive the signal f is applied to the base of transistor $T_4$ so that this transistor is turned on, and the signal e is applied to the base of transistor $T'_4$ so that this transistor is turned off. As a result of the current mirror comprising the transistors $T_5$ and $T'_5$ the weighted sum of the currents $\Sigma i_e$ will flow as indicated by the solid arrows, through the transistors $T'_5$, $T_5$ and the transistor $T_6$ of the pair $T_6 - T'_6$ whose emitters are interconnected and connected to the collector of $T_5$. Similarly, when the difference between two consecutive synthesized levels is negative, the signal e turns on $T'_4$, while the signal f turns off $T_4$. As a result of the current mirror comprising the transistors $T_5$ and $T''_5$, $\Sigma i_e$ flows, as is indicated by the dashed arrows, through the transistors $T''_5$, $T_5$, $T'_6$ and, as a result of the current mirror comprising the transistor pair $T_7 - T'_7$, through transistor $T_8$. It is to be noted that the solid and dashed arrows have opposite directions at the terminals of the capacitor 30 arranged between ground and the point which is common to the collectors of the transistors $T_6$ and $T_8$, which provides the change of sign when the summation of the differences between consecutive synthesized levels $$\sum_{k=1}^{16} (\Sigma i_e)_k$$

available across said capacitor constitutes the analogue quantity, k being an integer between 1 and the number of sampling levels occurring over one period of the sinusoidal function.

What is claimed is:

1. An analogue current-switching element comprising an integrated circuit injection logic gate of the I²L type, that includes an injection transistor and a switching transistor, said element comprising a signal input coupled to an emitter of the injection transistor, a switching-signal input coupled to a base of the switching transistor, said switching transistor comprising a plurality of collectors, means coupling one of said collectors to the base of said switching transistor and other ones of said collectors to respective ones of a plurality of current inputs, a switching signal either turning on said switching transistor whereby a current supplied by a current source and injected at said signal input is reflected to said plurality of current inputs, or turning off said transistor whereby said injected current is diverted towards the switching-signal input, and means connecting the base of said injection transistor to the emitter of said switching transistor to form a signal output junction point such that, in said turned-on state, said injected current is transferred to said signal output with a specific transfer coefficient which is a function of the characteristics of said transistors of the I²L gate.

2. A switching element as claimed in claim 1, wherein said transfer coefficient becomes equal to unity when said switching transistor has only one said collector, said one collector being coupled to its base.

3. A switching element as claimed in claim 1 or claim 2, characterized in that at least a second identical switching element is connected in cascode with the first switching element, means connecting a signal input of the second switching element to the signal output of the first switching element, the signal input and output of the cascode arrangement being respectively formed by the signal input of the first switching element and the signal output of the second switching element, the switching-signal inputs receiving the same signal values simultaneously.

4. An analog current switch comprising: a signal input terminal, a switching signal input terminal, means for coupling the signal input terminal to a current source, an injection transistor having an emitter coupled to said signal input terminal, a switching transistor having a plurality of collectors, an emitter, and a base connected to said switching signal input terminal, means connecting a first one of said plurality of collectors to the base of the switching transistor, means connecting a collector of the injection transistor to the base of the switching transistor, means connecting a second collector of the switching transistor to a current input terminal, and means connecting a base of the injection transistor to the emitter of the switching transistor to form a junction point, said junction point forming a signal output terminal of the analog current switch, a switching signal at the switching signal input terminal turning the switching transistor on and off so that a current from said current source injected at said input terminal produces currents in the first and second collectors of the switching transistor when the switching transistor is turned on, the injected current being diverted to the switching signal input terminal when the switching signal turns the switching transistor off, and wherein when the switching transistor is turned on the injected current is transferred to said signal output terminal with a specific transfer characteristic that is a function of the characteristics of said transistors.

5. A current switch as claimed in claim 4 wherein the switching transistor includes a third collector coupled to a second current input terminal whereby a current also flows in the third collector when the switching transistor is turned on, the currents in the first, second and third collectors all being approximately equal.

6. A current switch as claimed in claim 4 wherein the current gain factors of the injection and switching transistors have a relatively high value whereby the collector currents in the first and second collectors of the switching transistors are each equal to the injected current at the signal input terminal when the switching transistor is turned on.

7. A current switch as claimed in claim 4 wherein the injection and switching transistors comprise PNP and NPN transistors, respectively.

8. An analog current switch comprising: a signal input terminal, a switching signal input terminal, means for coupling the signal input terminal to a current source, an injection transistor having an emitter coupled to said signal input terminal, a switching transistor having a collector directly connected to its base and said base connected to said switching signal input terminal, means connecting a collector of the injection transistor to the base of the switching transistor, and means connecting a base of the injection transistor to the emitter of the switching transistor to form a junction point, said junction point forming a signal output terminal of the analog current switch, a switching signal at the switching signal input terminal turning the switching transistor on and off so that a current from said current source injected at said signal input terminal produces a current in the collector of the switching transistor when the switching transistor is turned on, the injected current being diverted to the switching signal input terminal when the switching signal turns the switching transistor off, and wherein when the switching transistor is turned on the injected current is transferred to said signal output terminal with a transfer coefficient of one.

9. An analog switch comprising first and second identical analog current switches each as claimed in claim 8, means connecting the signal input terminal of the second analog current switch to the signal output terminal of the first analog current switch to form a cascode arrangement of the first and second analog current switches, the signal input and output terminals of the analog switch being formed by the signal input terminal of the first analog current switch and the signal output terminal of the second analog current switch, respectively, and wherein the switching signal input terminals of the first and second analog current switches receive switching signals in synchronism.

* * * * *